(12) United States Patent
Hobbs (10) Patent No.: US 7,851,794 B2
(45) Date of Patent: Dec. 14, 2010

(54) ROTATING CONTACT ELEMENT AND METHODS OF FABRICATION

(75) Inventor: Eric D. Hobbs, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 372 days.

(21) Appl. No.: 11/617,394

(22) Filed: Dec. 28, 2006

(65) Prior Publication Data
US 2008/0157789 A1 Jul. 3, 2008

(51) Int. Cl.
*H01L 21/00* (2006.01)
(52) U.S. Cl. .................. 257/48; 257/E21.521
(58) Field of Classification Search .......... 257/666, 257/48; 361/773; 439/700
See application file for complete search history.

(56) References Cited

U.S. PATENT DOCUMENTS

| 4,781,640 | A  | * | 11/1988 | Tornoe et al. | 445/50 |
| 4,793,816 | A  | * | 12/1988 | Pittman et al. | 439/79 |
| 5,366,380 | A  | * | 11/1994 | Reymond | 439/66 |
| 5,864,946 | A  | * | 2/1999 | Eldridge et al. | 29/843 |
| 6,624,648 | B2 | * | 9/2003 | Eldridge et al. | 324/761 |
| 6,945,827 | B2 | * | 9/2005 | Grube et al. | 439/700 |
| 6,970,005 | B2 | * | 11/2005 | Rincon et al. | 324/754 |
| 7,385,411 | B2 | * | 6/2008 | Eldridge | 324/761 |
| 2002/0179904 | A1 | * | 12/2002 | Zhou et al. | 257/48 |
| 2004/0121627 | A1 | * | 6/2004 | Grube et al. | 439/66 |

OTHER PUBLICATIONS

International Search Report and Written Opinion mailed Oct. 14, 2008 for PCT Application No. PCT/US07/86667.

* cited by examiner

*Primary Examiner*—Leonardo Andújar
*Assistant Examiner*—William Harriston
(74) *Attorney, Agent, or Firm*—Kirton & McConkie (57) ABSTRACT

Rotating contact elements and methods of fabrication are provided herein. In one embodiment, a rotating contact element includes a tip having a first side configured to contact a device to be tested and an opposing second side; and a plurality of deformed members extending from the second side of the tip and arranged about a central axis thereof, wherein the tip rotates substantially about the central axis upon compression of the plurality of deformed members.

30 Claims, 5 Drawing Sheets

ROTATING CONTACT ELEMENT AND METHODS OF FABRICATION

CROSS-REFERENCE TO RELATED APPLICATIONS

This application is related to U.S. patent application Ser. No. 11/617,373, filed on an even date herewith, by John Gritters, et al., and entitled, "Resilient Contact Element and Methods of Fabrication". The aforementioned patent application is incorporated herein by reference in its entirety.

BACKGROUND OF THE INVENTION

1. Field of the Invention

Embodiments of the present invention generally relate to testing of partially or fully completed semiconductor devices, and more particularly, to resilient contact elements for testing such devices.

2. Description of the Related Art

When testing partially or fully completed semiconductor devices formed on a semiconductor substrate, such as integrated circuits and the like, a contact element is typically brought into contact with the device to be tested—also referred to as a device under test (or DUT). The contact element is typically part of a probe card assembly or other similar device coupled to a test mechanism that provides electrical signals to terminals on the DUT in accordance with a predetermined testing protocol.

When contacting the terminals of the DUT, the contact element typically is required to breakthrough a layer of oxide formed on the terminals. Accordingly, the contact elements typically are pressed against the surface of the DUT with sufficient force and to cause the contact element to scrub the surface of the DUT in order to break through the oxide layer and establish a reliable electrical contact therewith. However, as devices continued to shrink in size, the range of motion available for scrubbing the terminals of the DUT similarly continues to shrink, thereby, increasing the difficulty in establishing reliable electrical contact with the surface of the DUT.

Therefore, there is a need in the art for improved contact element.

SUMMARY OF THE INVENTION

Rotating contact elements and methods of fabrication are provided herein. In one embodiment, a rotating contact element includes a tip having a first side configured to contact a device to be tested and an opposing second side; and a plurality of deformed members extending from the second side of the tip and arranged about a central axis thereof, wherein the tip rotates substantially about the central axis upon compression of the plurality of deformed members.

In some embodiments of the invention, a probe card assembly for testing a semiconductor is provided. In some embodiments, the probe card assembly includes a probe substrate; and at least one contact element comprising a tip having a first side configured to contact a device to be tested and an opposing second side; and a plurality of deformed members extending from the second side of the tip and arranged about a central axis thereof, wherein the tip rotates substantially about the central axis upon deformation of the plurality of deformed members.

In some embodiments of the invention, a method of fabricating a resilient contact element is provided. In some embodiments, the method of fabricating a resilient contact element includes providing an assembly having a plurality of members arranged about a central axis and having respective first ends coupled to a first layer and respective second ends coupled to a second layer; and separating the first and second layers to deform the plurality of members and form the resilient contact element.

In some embodiments of the invention, a rotating contact element is provided. In some embodiments, the rotating contact element may be formed by providing an assembly having a plurality of members arranged about a central axis and having respective first ends coupled to a first layer and respective second ends coupled to a second layer; and separating the first and second layers to deform the plurality of members and form the resilient contact element.

In some embodiments of the invention, a method of testing a semiconductor device is provided. In some embodiments, the method of testing includes providing a probe card assembly having at least one contact element comprising a tip having a first side configured to contact a device to be tested and an opposing second side, and a plurality of deformed members extending from the second side of the tip and arranged about a central axis thereof, wherein the tip rotates substantially about the central axis upon compression of the plurality of deformed members; contacting at least one terminal of the device with respective tips of the at least one contact element; and providing one or more electrical signals to the at least one terminal through the probe card assembly.

In some embodiments of the invention, a semiconductor device is provided. In some embodiments, the semiconductor device is tested by providing a probe card assembly having at least one contact element comprising a tip having a first side configured to contact a device to be tested and an opposing second side, and a plurality of deformed members extending from the second side of the tip and arranged about a central axis thereof, wherein the tip rotates substantially about the central axis upon compression of the plurality of deformed members; contacting at least one terminal of the device with respective tips of the at least one contact element; and providing one or more electrical signals to the at least one terminal through the probe card assembly.

BRIEF DESCRIPTION OF THE DRAWINGS

So that the manner in which the above-recited features of the present invention and others described below can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the Figures. The images used in the drawings are simplified for illustrative purposes and are not necessarily depicted to scale.

DETAILED DESCRIPTION

The present invention provides embodiments of rotating contact elements and probe card assemblies incorporating the same. Methods of fabrication and use of the rotating contact elements and probe card assemblies are further provided. The rotating contact element advantageously provides improved electrical contact with device under test with a reduced scrub as compared to conventional contact elements. Moreover, the rotating contact element disclosed herein advantageously provides for closer contact element spacing and, therefore, higher density arrays of contact elements.

Figure 1:
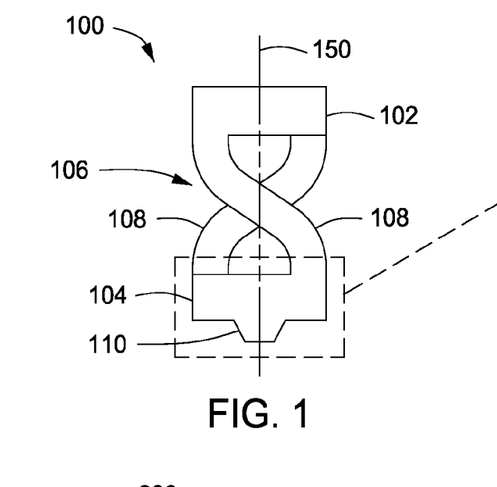
FIG. 1 depicts a schematic side view of a contact element according to some embodiments of the present invention.
Figure 3:
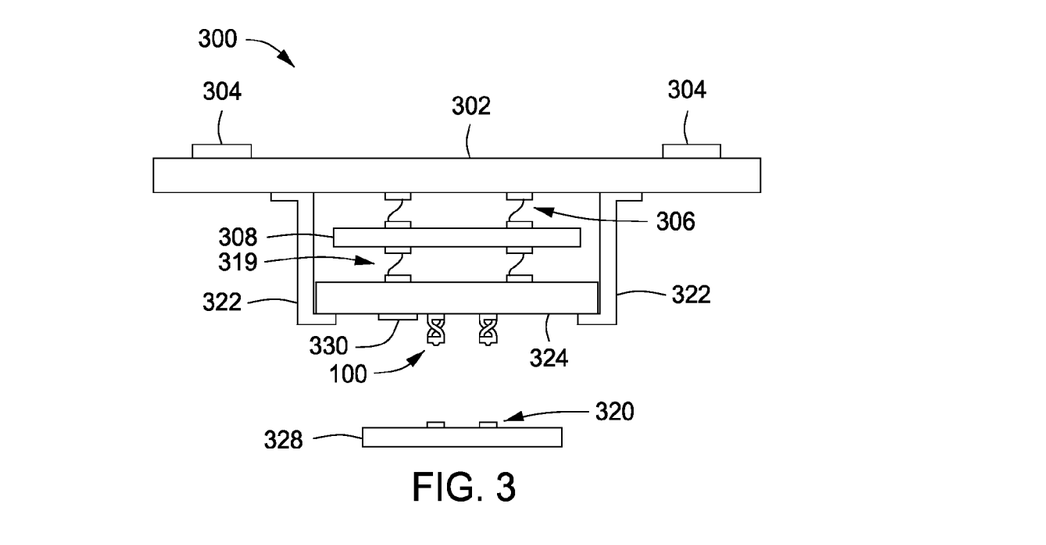
FIG. 3 depicts a probe card assembly having a resilient contact element according to some embodiments of the present invention.

FIG. 1 depicts a rotating contact element 100 in accordance with some embodiments of the present invention. The rotating contact element 100 generally includes a base 102 and a tip 104 coupled together by a resilient portion 106 disposed therebetween. The base 102 is generally configured to be secured to a substrate (such as shown in FIG. 3) to support the rotating contact element 100 and to facilitate control thereof during use.

Figure 1A:
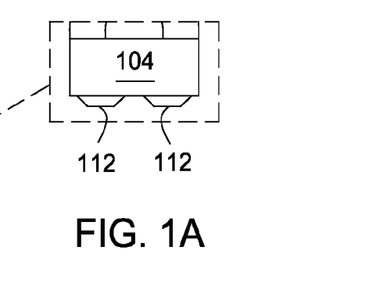
FIG. 1A depicts a detail of a tip of the contact element according to some embodiments of the present invention.

The tip 104 may include one or more contacts 110 formed on a lower surface thereof. The tip 104 and/or the contacts 110 are generally configured to establish reliable temporary electrical contact with the surface of the device to be tested (e.g., to break through an oxide layer formed on the surface of a device under test, or DUT, when brought into contact therewith). It is contemplated that the geometry, number, and arrangement of the contacts 110 may take numerous forms suitable at least for providing the reliable temporary electrical contact discussed above. For example, the FIG. 1A illustratively depicts a tip 104 having two contacts 112 formed disposed along opposite sides of the tip 104. Other variations in the number and geometry of contacts are contemplated.

The resilient portion 106 generally includes a plurality of deformed members 108. The deformed members 108 have opposing ends respectively coupled to the base 102 and the tip 104. The deformed members 108 may be formed integrally with one or more of the base 102 and the tip 104 (e.g., the base 102, tip 104, and resilient portion 106 of the contact element 100 may be formed from a single material or built up of layers of one or more materials). Alternatively, the deformed members 108 may be coupled to one or more of the base 102 and the tip 104 in other suitable ways, such as by bonding, or the like.

Figure 2A:
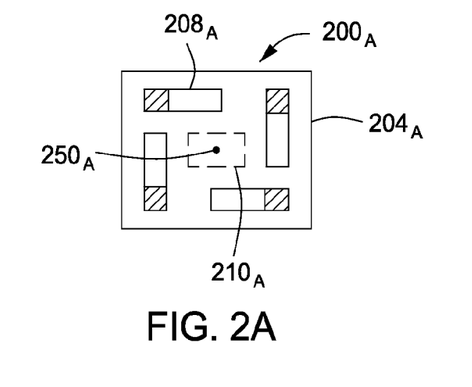
FIGS. 2A-2B depict top views, partially in cross-section, of a contact element according to some embodiments of the present invention.
Figure 2B:
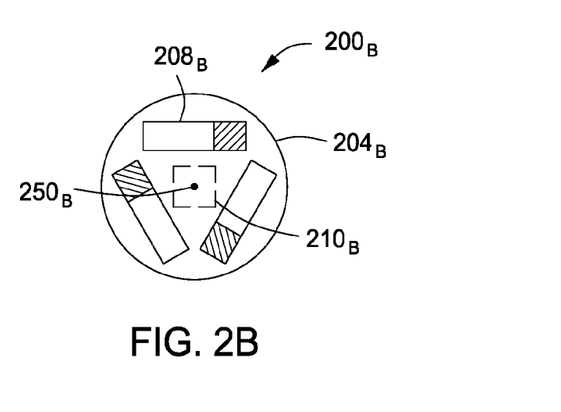

The plurality of deformed members 108 are arranged about a central axis 150, which may or may not coincide with a central axis (not shown) of any of the base 102, the tip 104, or any contacts 110, 112 formed thereon. When the base 102 and the tip 104 are moved closer to each other, such as when the tip 104 is brought into contact with a surface of a DUT during testing, the plurality of deformed members 108 develop a torque that causes the tip 104 to rotate with respect to the base 102. For example, FIGS. 2A and 2B depict a top views of the rotating contact element 100 of contact elements $200_A$, $200_B$ according to some embodiments of the present invention. In the embodiment depicted in FIG. 2A, a tip $204_A$ has four deformed members $208_A$ extending therefrom and arranged about a central axis $250_A$. In the embodiment depicted in FIG. 2B, a contact element $200_B$ has a round tip $204_B$ with three deformed members $208_B$ disposed about a central axis $250_B$. Embodiments having a round tip facilitate closer spacing between adjacent rotating contact elements without interference from any corners of the respective tips upon rotation.

The base, resilient portion, tip, and contact of the rotating contact element may be fabricated from the same or different materials and may comprise one or more electrically conductive and/or nonconductive materials. Examples of suitable conductive materials include metals and conductive polymers. In some embodiments, the conductive materials may comprise nickel, copper, cobalt, iron, gold, silver, elements of the platinum group, noble metals, semi-noble metals, elements of the palladium group, tungsten, molybdenum, beryllium, and the like, and alloys thereof (such as nickel-cobalt alloys, copper-beryllium alloys, and the like).

Although certain embodiments of a rotating contact element are depicted in FIGS. 1-2, it is contemplated that many other embodiments may be fabricated utilizing the principles discussed above. For example, greater or fewer deformed members may be provided, the geometry or arrangement of the deformed members may be varied, the size and shape of the base, tip, and any contacts formed thereon may also be varied, and the like.

FIG. 3 depicts a probe card assembly 300 utilizing one or more rotating contact elements according to some embodiments of the present invention. The exemplary probe card assembly 300 illustrated in FIG. 3 can be used to test one or more electronic devices (represented by a device under test, or DUT, 328). The DUT 328 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices.

The probe card assembly 300 generally acts as an interface between a tester (not shown) and the DUT 328. The tester, which can be a computer or a computer system, typically controls testing of the DUT 328, for example, by generating test data to be input into the DUT 328, and receiving and evaluating response data generated by the DUT 328 in response to the test data. The probe card assembly 300 includes electrical connectors 304 configured to make electrical connections with a plurality of communications channels (not shown) from the tester. The probe card assembly 300 also includes one or more rotating contact elements 100 configured to be pressed against, and thus make temporary electrical connections with, one or more input and/or output terminals 320 of DUT 328. The rotating contact elements 100 may be similar to the various embodiments disclosed herein and are typically configured to correspond to the terminals 320 of the DUT 328 and may be arranged in one or more arrays having any desired geometry.

The probe card assembly 300 may include one or more substrates configured to support the connectors 304 and the rotating contact elements 100 and to provide electrical connections therebetween. The exemplary probe card assembly 300 shown in FIG. 3 has three such substrates, although in other implementations, the probe card assembly 300 can have more or fewer substrates. In the embodiment depicted in FIG. 3, the probe card assembly 300 includes a wiring substrate 302, an interposer substrate 308, and a probe substrate 324. The wiring substrate 302, the interposer substrate 308, and the probe substrate 324 can generally be made of any type of suitable material or materials, such as, without limitation, printed circuit boards, ceramics, organic or inorganic materials, and the like, or combinations thereof.

Additionally, in some embodiments, the probe card assembly 300 may include one or more active or passive electronic components (such as capacitors, resistors, and the like) disposed on a lower surface thereof, along with the plurality of rotating contact elements 100. For example, as shown in FIG. 3, a component 330 is disposed on a lower surface of the wiring substrate 324. As can be seen in the Figure, the rotating contact elements 100 advantageously do not physically interfere with the components 330 due to the vertical displacement of the tips of the rotating contact elements 100 when engaged with the DUT 328. Thus, the rotating contact elements 100 may advantageously be more densely configured while avoiding contact with each other and any other components 330 during operation.

Electrically conductive paths (not shown) are typically provided from the connectors 304 through the various substrates to the rotating contact elements 100. For example, in the embodiment depicted in FIG. 3, electrically conductive paths (not shown) may be provided from the connectors 304 through the wiring substrate 302 to a plurality of electrically conductive spring interconnect structures 306. Other electrically conductive paths (not shown) may be provided from the spring interconnect structures 306 through the interposer substrate 308 to a plurality of electrically conductive spring interconnect structures 319. Still other electrically conductive paths (not shown) may further be provided from the spring interconnect structures 319 through the probe substrate 324 to the rotating contact elements 100 and/or any components 330. The electrically conductive paths through the wiring substrate 302, the interposer substrate 308, and the probe substrate 324 can comprise electrically conductive vias, traces, or the like, that may be disposed on, within, and/or through the wiring substrate 302, the interposer substrate 308, and the probe substrate 324.

The wiring substrate 302, the interposer substrate 308, and the probe substrate 324 may be held together by one or more brackets 322 and/or other suitable means (such as by bolts, screws, or other suitable fasteners). The configuration of the probe card assembly 300 shown in FIG. 3 is exemplary only and is simplified for ease of illustration and discussion and many variations, modifications, and additions are contemplated. For example, a probe card assembly may have fewer or more substrates (e.g., 302, 308, 324) than the probe card assembly 300 shown in FIG. 3. As another example, a probe card assembly may have more than one probe substrate (e.g., 324), and each such probe substrate may be independently adjustable. Non-limiting examples of probe card assemblies with multiple probe substrates are disclosed in U.S. patent application Ser. No. 11/165,833, filed Jun. 24, 2005. As another example, the probe substrate and/or substrates may have more than one type of contact elements disposed thereon. For example, a probe substrate may have rotating contact elements as disclosed herein in combination with other types of resilient contact elements, such as cantilevered contact elements, or the like. Additional non-limiting examples of probe card assemblies are illustrated in U.S. Pat. No. 5,974,662, issued Nov. 2, 1999 and U.S. Pat. No. 6,509, 751, issued Jan. 21, 2003, as well as in the aforementioned U.S. patent application Ser. No. 11/165,833. It is contemplated that various features of the probe card assemblies described in those patents and application may be implemented in the probe card assembly 300 shown in FIG. 3 and that the probe card assemblies described in the aforementioned patents and application may benefit from the use of the inventive resilient contact elements disclosed herein.

In operation, the rotating contact elements 100 are brought into contact with the terminals 320 of the DUT 328 by moving at least one of the DUT 328 or the probe card assembly 300. Typically, the DUT 328 can be disposed on a movable support disposed in the test system (not shown) that moves the DUT 328 into sufficient contact with the rotating contact elements 100 to provide reliable electrical contact with the terminals 320. The DUT 328 can then tested per a pre-determined protocol as contained in the memory of the tester. For example, the tester may generate power and test signals that are provided through the probe card assembly 300 to the DUT 328. Response signals generated by the DUT 328 in response to the test signals are similarly carried through the probe card assembly 300 to the tester, which may then analyze the response signals and determine whether the DUT 328 responded correctly to the test signals.

When moving the DUT 328 to contact the rotating contact elements 100 of the probe card assembly 300, the DUT 328 typically continues to move towards the probe card assembly 300 until all of the rotating contact elements 100 come into sufficient contact with the terminals 320. Due to one or both of the non-planarity of the respective tips of the rotating contact elements 100 disposed on the probe card assembly 300 and the variations of the heights of the terminals 320, the DUT 328 may continue to move towards the probe card assembly 300 for an additional non-limiting exemplary range of about 1-4 mils (about 25.4-102 µm) after the initial contact of the first rotating contact element 100 to contact the DUT 328 (sometimes referred to as overtravel). The actual amount of overtravel depends on the characteristics of the non-planarity of the respective tips of the rotating contact elements 100 and/or the variations in height of the terminals 320. Accordingly, some of the rotating contact elements 100 may undergo more deflection than others.

In cantilevered contact elements, the scrub of the contact element is defined by the forward distance that the tip moves after contacting the surface of the DUT. This is sometimes referred to as the scrub ratio when dividing the forward distance moved by the tip by the downward distance moved by the contact element after initial contact with the DUT. However, in the present invention, the scrub of the surface of the DUT is rotational, rather than linear. Therefore, regardless of the vertical displacement of the rotating contact elements, the rotating contact elements 100 advantageously reduce the scrub distance (or ratio) in operation. Moreover, the rotating contact elements further advantageously facilitate closer spacing of the rotating contact elements to each other or to other components, as compared to cantilevered contact elements, thereby facilitating higher density packing of components and contact elements on a given substrate.

For example, rotating contact elements in accordance with some embodiments of the invention may have a diameter (or largest cross-sectional dimension perpendicular to the axis of rotation) of in one non-limiting example, less than 1 mm, or in another non-limiting example, less than 500 µm, or in another non-limiting example, less than 200 µm. Moreover, arrays of rotating contact elements in accordance with some embodiments of the invention may have a tip-to-tip spacing, or pitch, of in one non-limiting example, less than 1 mm, or in another non-limiting example, less than 500 µm, or in another non-limiting example, less than 200 µm. Moreover, arrays of rotating contact elements in accordance with some embodiments of the invention may have a tip-to-tip spacing as discussed above in a radial pitch, or planar area (e.g., the rotating contact elements may be closely spaced in an area, or along any radius extending from the rotating contact element, as compared to linearly, as required for cantilevered contact elements).

FIGS. 4A-G depict side and top views of a contact element in accordance with some embodiments of the present invention during various stages of construction. FIG. 5 depicts a process 500 for fabrication of the contact element shown in FIGS. 4A-G according to some embodiments of invention. Although the following discussion with respect to FIGS. 4-5 reflect the fabrication of a single contact element having a particular configuration, it is contemplated that contact elements having other configurations or a plurality of contact elements on a single substrate may be fabricated utilizing the disclosed methods.

Figure 4A:
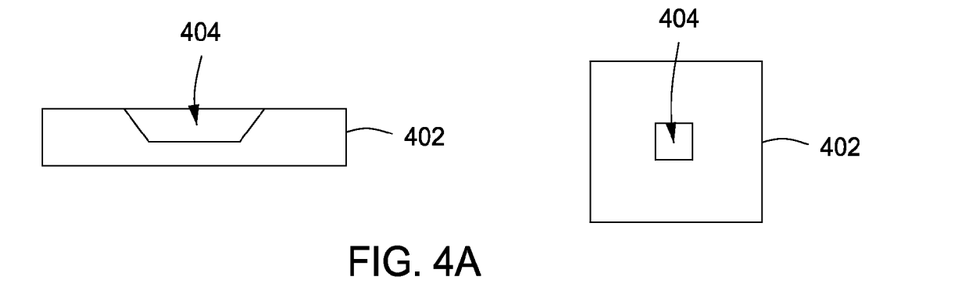
FIGS. 4A-G depict stages of fabrication of a resilient contact element in accordance with some embodiments of the present invention.

The exemplary process 500 begins at 510, wherein a first substrate 402 having recess 404 formed therein is provided (as shown in FIG. 4A). The substrate may comprise any suitable substrate such as silicon, metals, conductive materials, plastic, or the like. The recess 404 may be geometrically configured to correspond to a contact to be formed on the contact element. Optionally, the recess 404 may be formed in the first substrate 402 at 512. The recess 404 may be formed in the first substrate 402 by any suitable process, such as by lithographic and etch processes (such as bulk micromachining, surface micromachining, or the like), other machining processes (such as electro-discharge machining (EDM), or the like), or nano-fabrication technologies (such as nano-imprint lithography, or the like), or the like, or combinations thereof. Although FIGS. 4A-G illustrate one type of recess 404 corresponding to one type of contact to be formed, other geometries are contemplated for use in various embodiments of the invention.

Figure 4B:
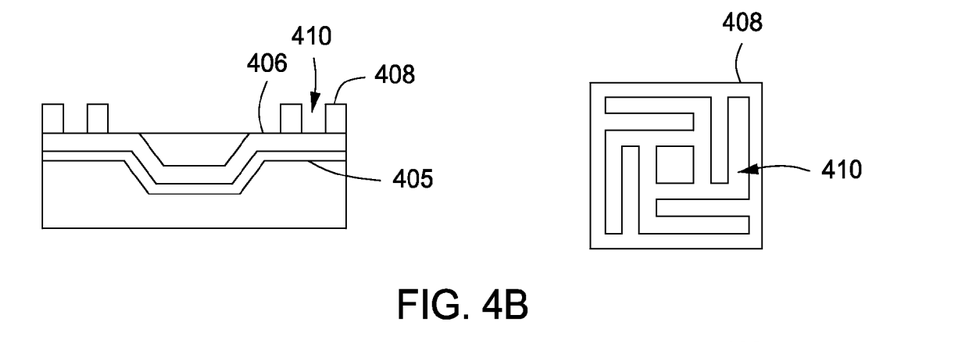
Figure 5:
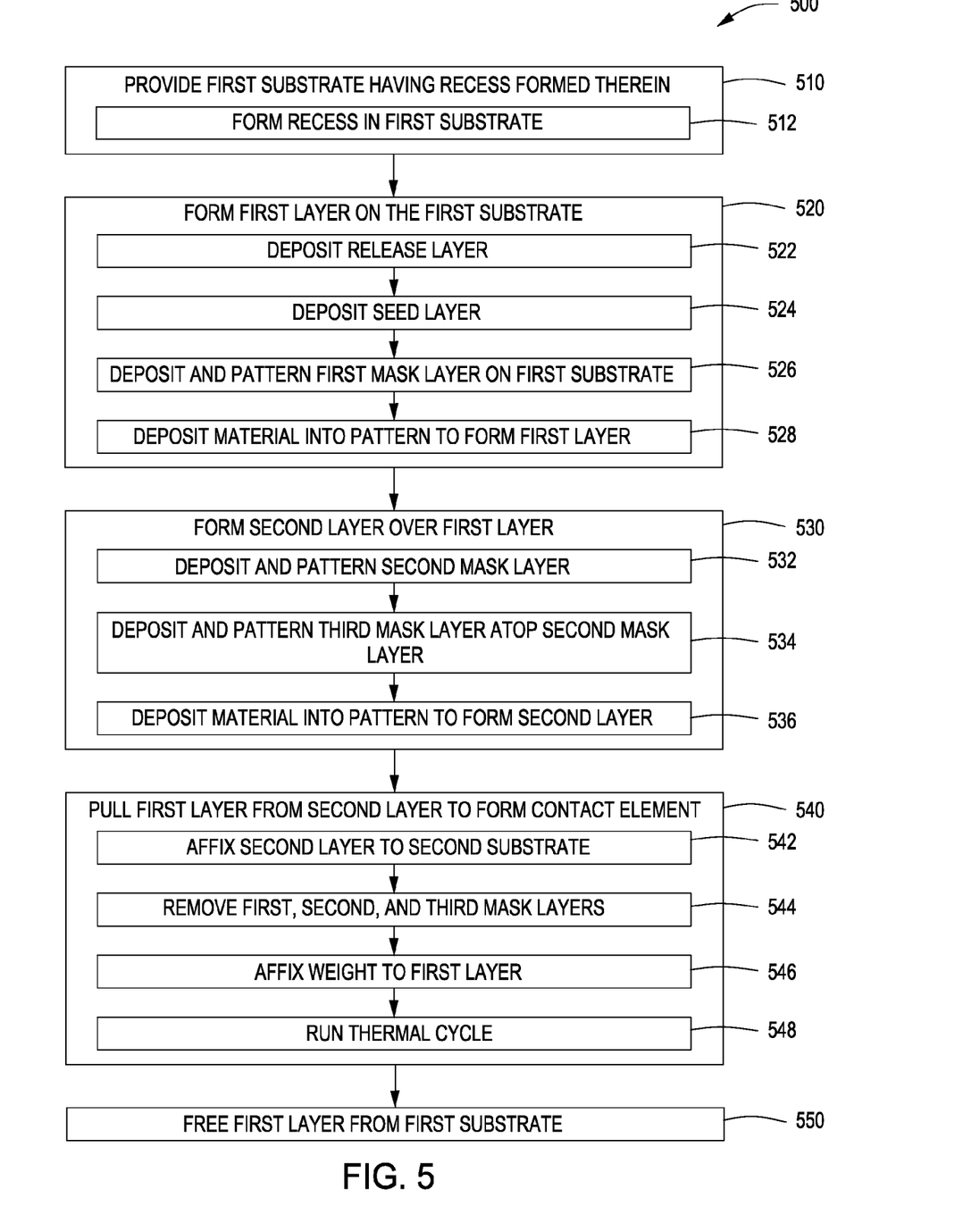
FIG. 5 depicts a flow chart for fabricating the resilient contact element depicted in FIGS. 4A-G.

Next, at 520, a first layer 412 may be formed on the first substrate 402. In some embodiments, a release layer 405 may be deposited on the first substrate 402 at 522 (as shown in FIG. 4B). The release layer 405 facilitates release of the first layer 412 from the first substrate 402 upon completion of fabrication of the rotating contact element. The release layer 405 may comprise copper, silicon oxide (SiO2), or the like.

In some embodiments, a seed layer 406 may be deposited atop the first substrate 402 at 524 (as shown in FIG. 4B). The seed layer 406 typically comprises a material that facilitates formation of the first layer 412 and may be deposited by chemical or physical vapor deposition (CVD or PVD), atomic layer deposition (ALD) or the like. Non-limiting examples of suitable materials for the seed layer 406 include copper, palladium, titanium, tungsten, silver, and combinations or alloys thereof. Optionally, the release layer 405 may function as the seed layer 406 (i.e., a single layer provides both the release and seed layer functions.)

A first mask layer 408 may be formed on the first substrate 402 at 526 (as shown in FIG. 4B). The first mask layer 408 may be formed prior or subsequent to the seed layer 406, when present, and generally defines a pattern 410 corresponding to the shape of the first layer 412. The mask layer 408 may comprise any suitable masking material such as a photosensitive resist material or the like and may be deposited and patterned by any suitable process.

Figure 4C:
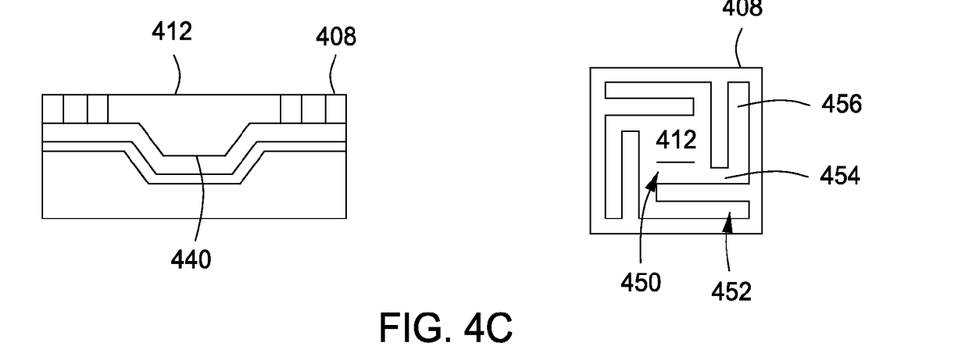

The first layer 412 may be deposited into the pattern 408 to form the first layer 412 at 528 (as shown in FIG. 4C). In the embodiment of FIGS. 4A-G, the pattern 410 depicted in FIG. 4B corresponds to the first layer 412 depicted in FIG. 4C (e.g., forming a tip 450 having a plurality of members 452 connected thereto at respective first ends 454, the members 452 extending towards respective second ends 456 in a spaced apart relation to the tip 450). A contact 440 may be formed by the deposition of the first layer 412 in the recess 404. The first layer 412 may comprise a material or combination of materials (or layers of a material or combination of materials) including at least one of the conductive materials discussed above with respect to FIG. 1-2. The first layer 412 may be deposited by plating, chemical or physical vapor deposition (CVD or PVD), or the like. Optionally, a first material may be deposited into the recess 404 to form the contact 440 and a second material may be deposited thereover and into the remaining portion of the pattern 410 defined by the first mask layer 408 to form the first layer 412.

Figure 4D:
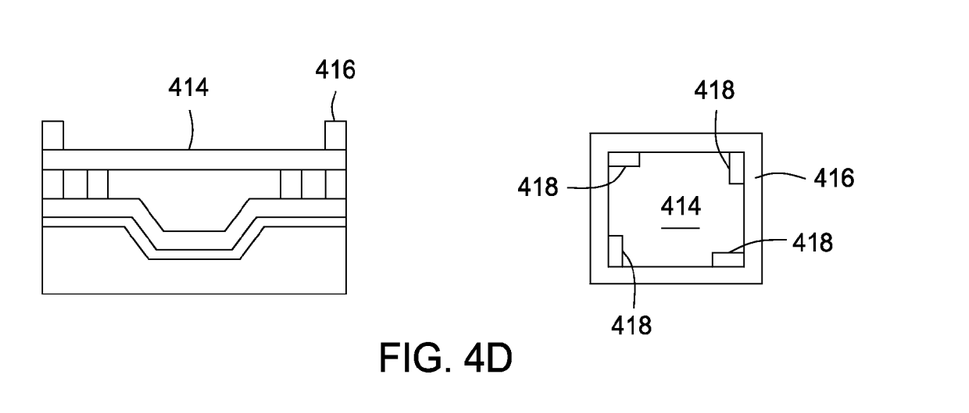
Figure 4E:
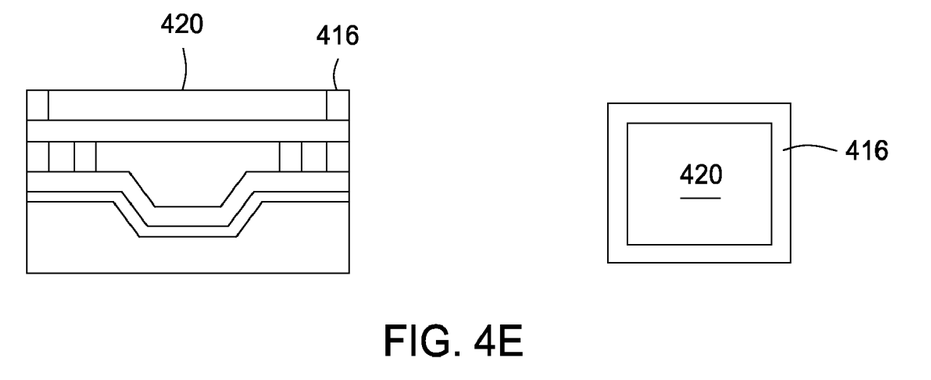

Next, a second layer 420 may be formed over the first layer 412 at 530. In some embodiments, a second mask layer 414 and a third mask layer 416 may be deposited and patterned at 532 and 534 (as shown in FIG. 4D). The second and third mask layers 414, 416 may be deposited and patterned similarly as described above with respect to the first mask layer 408. The second and third mask layers 414, 416 generally cover the first layer 412, leaving a plurality of openings 418 where it is desired to have the first layer 412 be connected to the second layer 420 (e.g., at the respective second ends 456 of the members 452), and further provide a pattern into which the second layer 420 is to be formed. A material or combination of materials may be deposited into the pattern provided by the second and third mask layers 414, 416 to form the second layer 420 at 536 (as shown in FIG. 4E) as described above for the first layer 412. Although the material forming the second layer 420 may generally be selected from the same group of materials as for forming the first layer 412, the first and second layers 412, 420 need not be fabricated from the same materials.

Thus, the second layer 420 may be connected to the first layer 412 via material deposited in the plurality of openings 418. For example, in the embodiment depicted in FIGS. 4A-G, the first layer 412 includes a tip 450 connected to a plurality of members 452 at respective first ends 454 thereof, and the second layer 420 is coupled to the plurality of members 452 and respective second ends 456 thereof.

Figure 4F:
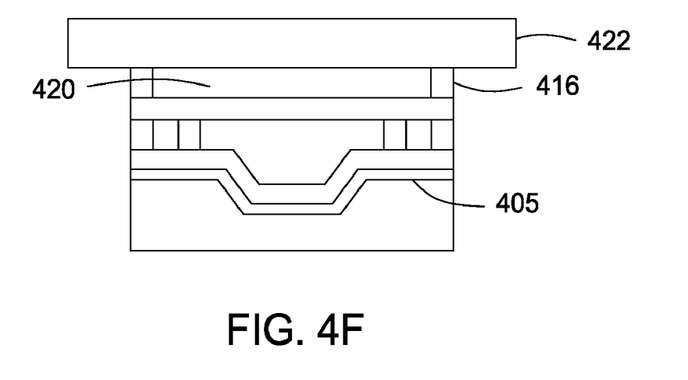
Figure 4G:
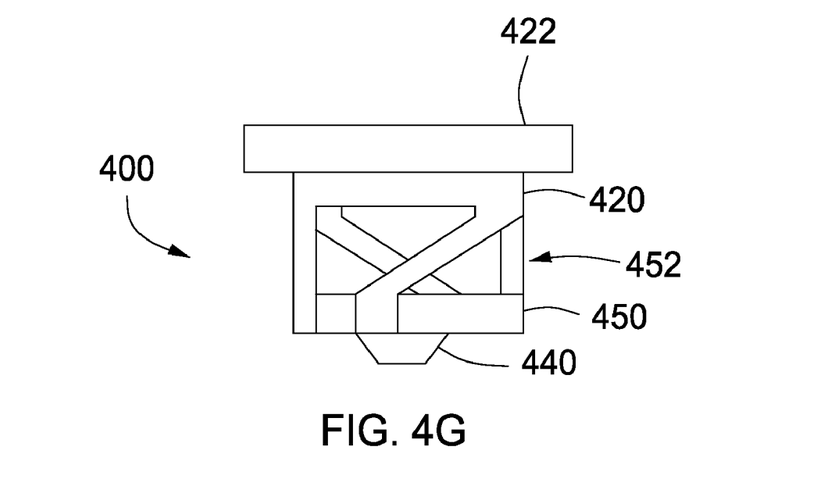

The first layer 412 and the second layer 420 may be moved apart relative to one another to deform the plurality of members 452 at 540, thereby forming a rotating contact element (as shown in FIG. 4G). The plurality of members 452 may be deformed by moving either or both of the first layer 412 or the second layer 420 in opposing directions relative to each other. In some embodiments, this may be accomplished by securing either or both of the first layer 412 or the second layer 420 and providing a force sufficient to move the first and second ends 454, 456 of the plurality of members 452 in opposing directions. In some embodiments, one of the first layer 412 or the second layer 420 may be secured and the force of gravity may be sufficient to move the ends in opposing directions.

For example, in some embodiments, the second layer 420 may be affixed to a second substrate 422 at 542 (as shown in FIG. 4F). The second layer 420 may be affixed to the second substrate 422 in any suitable manner, such as by clamping, brazing, bonding, soldering, or the like. The second substrate 422 facilitates handling of the final stages of fabrication of the rotating contact element and may comprise the same substrate as will be used in a probe card assembly (such as the probe substrate 324 depicted in FIG. 3).

The first, second and third mask layers 408, 414, 416 may be removed at 544 (not shown) prior to separating the first and second layers 412, 420 to deform the plurality of members 452. The mask layers 408, 414, 416 may be removed by any suitable methods, such as ashing, or the like. Optionally, the first, second and third mask layers 408, 414, 416 may be removed prior to affixing the second layer 420 to the second substrate 422.

Optionally, a weight (not shown) may be affixed to the first substrate 402 at 546 to increase the applied force due to gravity. The weight may be secured to the first substrate 402 in any suitable manner, such as by bolting, clamping, bonding, or the like.

In some embodiments, the rotating contact element may be subjected to a thermal process during the deformation of the plurality of members 452, such as, for example, heating of at least a portion of the members 452 prior to moving the first and second layers 412, 420 apart (for example, preheating), during the moving of the first and second layers 412, 420 (for example, heating during deformation), or while holding the first and second layers 412, 420 in a desired spaced-apart relation (for example, heating after deformation), or combinations thereof. The heating of the members 452 may be performed in any suitable manner, such as by exposure to a radiation source (e.g., infrared, x-ray, laser, or the like), passing an electrical current through the members 452, placing the rotating contact element in an oven, or the like.

The thermal process may further comprise a thermal cycle of heating and cooling the members 452 while maintaining the spaced-apart relation between the first and second layers 412, 420. The thermal cycle can include raising the temperature of the members 452 to a temperature that is greater than a recrystallization temperature for the materials comprising the members 452. The members 452 can then be cooled to a temperature below the recrystallization temperature for the materials comprising the members 452 while maintaining the desired deformation of the members 452 to facilitate maintaining the deformed shape of the members 452 upon removal of the deforming force. The temperature may be held to a level sufficiently low to prevent the second layer 420 from becoming separated from the second substrate 422 (for example, when the second layer 420 is bonded to the second substrate 422). The thermal cycle may comprise a temperature ramp-up time, a temperature hold time and a temperature ramp-down time. The thermal cycle generally comprises at least a temperature hold time sufficient to allow permanent deformation of the members 452 when the deforming force is removed. For example, in the embodiment depicted in FIG. 5, a thermal cycle may be run at 548 to permanently deform the plurality of members 452.

Upon exposing the members 452 to the thermal cycle, a rotating contact element 400 may thereby be formed. Next, the first layer 412 may be freed from the first substrate 402 at 550 as shown in FIG. 4G. The first layer 412 may be freed from the first substrate 402 by any suitable means, such as by etching away the release layer 405.

The rotating contact element 400 is now ready to be implemented as desired, for example, in a probe substrate for use in testing a DUT. As discussed above, a plurality of rotating contact elements 400 may be simultaneously formed in a desired configuration and attached to a substrate, such as a probe substrate, suitable for implementation in a probe card assembly.

Figure 6:
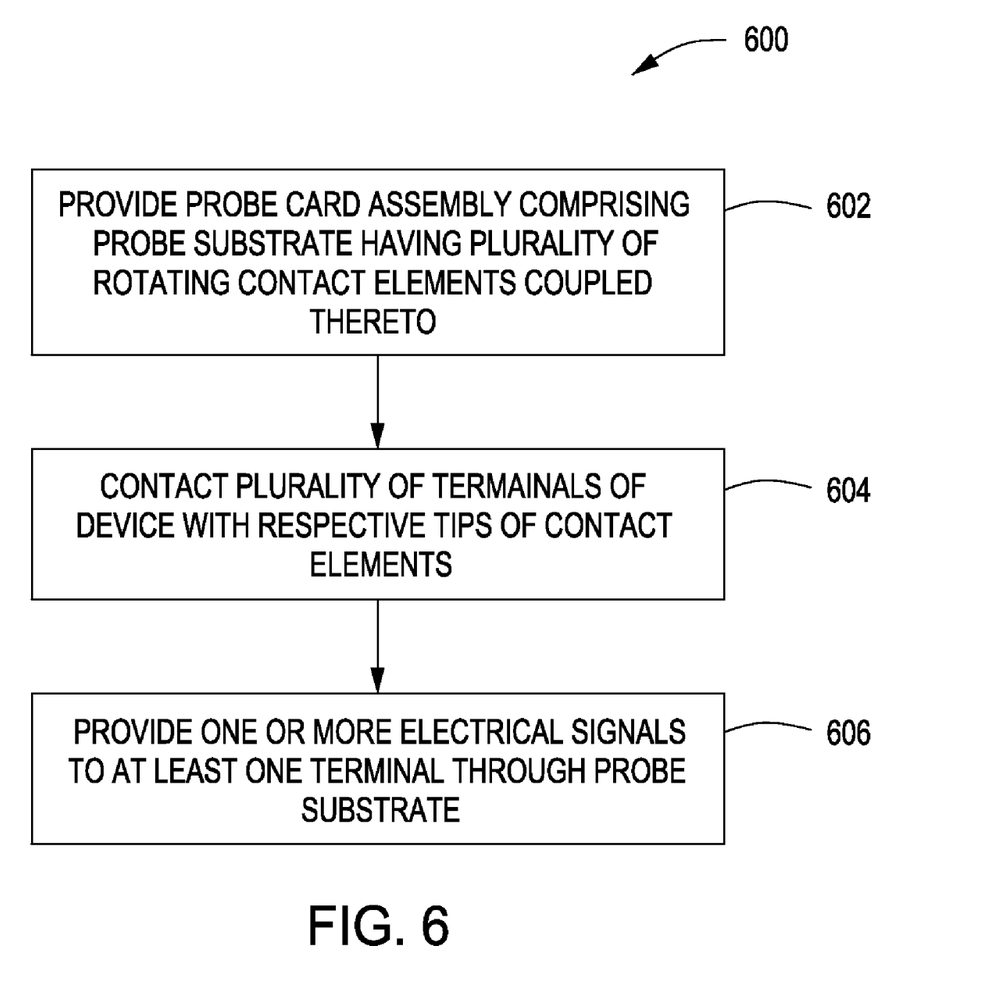
FIG. 6 depicts a flowchart of a method of testing a substrate in accordance with some embodiments of the present invention.

For example, FIG. 6 depicts a process 600 for testing a semiconductor device, or DUT, utilizing a probe card assembly 300 as described above with respect to FIGS. 1-3, according to some embodiments of the invention. The process 600 begins at 602, where a probe card assembly 300 is provided having a plurality of rotating contact elements 100 coupled thereto. The plurality of rotating contact elements 100 may be provided in one or more arrays corresponding to desired testing locations on the DUT (such as the terminals 320 shown in FIG. 3).

Next, at 604, a plurality of terminals 320 of a DUT 328 are contacted with respective tips of the rotating contact elements 100. For example, the DUT 328 may be raised to a point where at least some of the terminal 320 just touch at least some of the rotating contact elements 100. The DUT 328 may then be further raised to a point where all of the desired terminals 320 are in sufficient contact with all of the desired rotating contact elements 100. The positioning of the DUT 328 with respect to the rotating contact elements 100 causes the respective tips 104 be moved closer to their respective bases 102 through deflection of the deformed members 108 of their respective resilient portions 106. As discussed above, this deflection causes the tips 104 to rotate, thereby providing the necessary scrub to establish reliable electrical contact with the terminal 320 of the DUT 328. Next, at 306, one or more electrical signals are provided to at least one terminal 320 of the DUT 328 through the rotating contact elements 100 (e.g., as part of a testing routine implemented in a test system in which the DUT and probe card assembly may be contained).

Thus, methods apparatus suitable for testing devices having reduced feature sizes and methods of fabricating the same have been provided herein. The inventive apparatus and methods facilitate the testing of such devices with reduced scrub to the surface of the device under test and further facilitate more compact contact elements and spacing, thereby facilitating testing of DUT's having reduced feature sizes and more dense features.

While the foregoing is directed to embodiments of the present invention, other and further embodiments of the invention may be devised without departing from the basic scope thereof, and the scope thereof is determined by the claims that follow.

The invention claimed is:

1. A rotating contact element, comprising:
   a tip having a first side configured to contact a terminal of a semiconductor device to be tested and an opposing second side; and
   a plurality of deformed members lithographically formed in an initial shape upon and extending from the second side of the tip, the deformed members being permanently deformed into a deformed shape different than the initial shape, the deformed members being arranged about a central axis thereof, wherein the tip rotates substantially about the central axis upon compression of the plurality of deformed members.

2. The element of claim 1, further comprising a base coupled to respective ends of the plurality of deformed members opposite the tip.

3. The element of claim 1, wherein the tip further comprises one or more contacts extending from the first side thereof.

4. The element of claim 1, wherein the tip further comprises one contact extending from a center of the first side thereof.

5. The element of claim 1, wherein the tip further comprises a plurality of contacts extending from the first side thereof.

6. The element of claim 5, wherein each one of the plurality of contacts is aligned with a respective one of the plurality of deformed members.

7. The element of claim 1, wherein the tip and the plurality of deformed members are unitary.

8. The element of claim 1, wherein the tip and deformed members comprise at least one of nickel, cobalt, copper, or beryllium.

9. A probe card assembly for testing a semiconductor, comprising:
   a probe substrate; and at least one contact element coupled to the probe substrate and extending therefrom, the at least one contact element comprising:

a tip having a first side configured to contact a terminal of a semiconductor device to be tested and an opposing second side; and a plurality of deformed members lithographically formed in an initial shape upon and extending from the second side of the tip, the deformed members being permanently deformed into a deformed shape different than the initial shape, the deformed members being arranged about a central axis thereof, wherein the tip rotates substantially about the central axis upon compression of the plurality of deformed members.

10. The assembly of claim 9, further comprising a base coupled to respective ends of the plurality of deformed members opposite the tip.

11. The assembly of claim 9, wherein the tip further comprises one or more contacts extending from the first side thereof.

12. The assembly of claim 9, wherein the tip and the plurality of deformed members are unitary.

13. The assembly of claim 9, wherein the tip and deformed members comprise at least one of nickel, cobalt, copper, or beryllium.

14. The assembly of claim 9, further comprising a plurality of contact elements.

15. The assembly of claim 14, wherein the plurality of contact elements are arranged to correspond with a plurality of terminals disposed on a device to be tested.

16. The assembly of claim 9, wherein the probe card assembly is configured to pass electrical signals to and from respective tips of the contact elements to a plurality of electrical connectors disposed on the probe card assembly.

17. A method of testing a semiconductor device, comprising:

providing a probe card assembly having at least one contact element comprising a tip having a first side configured to contact a terminal of a semiconductor device to be tested and an opposing second side, and a plurality of deformed members lithographically formed in an initial shape upon and extending from the second side of the tip, the deformed members being permanently deformed into a deformed shape different than the initial shape, the deformed members being arranged about a central axis thereof, wherein the tip rotates substantially about the central axis upon compression of the plurality of deformed members;

contacting at least one terminal of the device with respective tips of the at least one contact element; and providing one or more electrical signals to the at least one terminal through the probe card assembly.

18. The method of claim 17, wherein step of contacting further comprises:

moving at least one of the probe card assembly or the device to establish an initial contact between the plurality of terminals of the device and the tips of the contact elements; and further moving at least one of the probe card assembly or the device to establish a desired contact pressure between the plurality of terminals of the device and the tips of the contact elements.

19. The method of claim 17, wherein the resilient contact elements have a lower scrub distance when contacting the device as compared to cantilevered contact elements.

20. The method of claim 17, wherein the contact elements produce a rotational scrub when contacting the device.

21. A semiconductor device tested by the method of claim 17.

22. The element of claim 1, wherein a largest cross-sectional dimension of the rotating contact element perpendicular to the axis of rotation is less than 1 mm.

23. The assembly of claim 9, wherein a largest cross-sectional dimension of the contact element perpendicular to the axis of rotation is less than 1 mm.

24. The element of claim 1, wherein a material composition of the deformed members comprises recrystallized material from heat treating the members.

25. The element of claim 2, wherein the tip and the base are farther apart while the deformed members are in the deformed shape than while the deformed members are in the initial shape.

26. The assembly of claim 9, wherein a material composition of the deformed members comprises recrystallized material from heat treating the members.

27. The assembly of claim 10, wherein the tip and the base are farther apart while the deformed members are in the deformed shape than while the deformed members are in the initial shape.

28. The method of claim 17, wherein a material composition of the deformed members comprises recrystallized material from heat treating the members.

29. The method of claim 17 further comprising a base, wherein the deformed members connect the tip and the base.

30. The method of claim 29, wherein the tip and the base are farther apart while the deformed members are in the deformed shape than while the deformed members are in the initial shape.

* * * * *